United States Patent
Dings et al.

(10) Patent No.: US 7,645,495 B2
(45) Date of Patent: Jan. 12, 2010

(54) METHOD AND APPARATUS FOR TREATING A SUBSTRATE

(75) Inventors: Franciscus Cornelius Dings, Veldhoven (NL); Marinus Franciscus Johannes Evers, Heeze (NL); Michael Adrianus Theodorus Hompus, Helmond (NL); Martin Dinant Bijker, Helmond (NL)

(73) Assignee: OTB Solar B.V., Eindhoven (NL)

( * ) Notice: Subject to any disclaimer, the term of this patent is extended or adjusted under 35 U.S.C. 154(b) by 572 days.

(21) Appl. No.: 10/538,652

(22) PCT Filed: Dec. 12, 2003

(86) PCT No.: PCT/NL03/00886

§ 371 (c)(1),
(2), (4) Date: Oct. 31, 2005

(87) PCT Pub. No.: WO2004/053190

PCT Pub. Date: Jun. 24, 2004

(65) Prior Publication Data

US 2006/0231031 A1   Oct. 19, 2006

(30) Foreign Application Priority Data

Dec. 12, 2002  (NL) .................................. 1022155

(51) Int. Cl.
*C23C 16/00* (2006.01)
*H05H 1/24* (2006.01)
*B01J 19/08* (2006.01)

(52) U.S. Cl. .................. 427/569; 118/715; 118/723 R; 427/457; 427/248.1

(58) Field of Classification Search .......... 427/569, 427/457, 248.1; 118/715
See application file for complete search history.

(56) References Cited

U.S. PATENT DOCUMENTS 3,735,727 A   5/1973   Sussmann (Continued)

FOREIGN PATENT DOCUMENTS

GB         2 165 990 A   4/1986

(Continued)

OTHER PUBLICATIONS

Buuron et al., "Fast Deposition of Amorphous Hydrogenated Carbon and Silicon Layers," 2296a Journal of Applied Polymer Science: Applied Polymer Symposium 54 (New York, US), ( 1994).

*Primary Examiner*—Timothy H Meeks
*Assistant Examiner*—Mandy C Louie
(74) *Attorney, Agent, or Firm*—Pillsbury Winthrop Shaw Pittman LLP

(57) ABSTRACT

A method for treating a surface of at least one substrate, wherein the at least one substrate is placed in a process chamber, wherein the pressure in the process chamber is relatively low, wherein a plasma is generated by at least one plasma source, wherein, during the treatment, at least one plasma source (3) and/or at least one optionally provided treatment fluid supply source is moved relative to the substrate surface. The invention further provides an apparatus for treating a surface of at least one substrate, wherein the apparatus is provided with a process chamber and at least one plasma source, wherein the at least one plasma source (3) and/or at least one optionally provided treatment fluid supply source is movably arranged.

16 Claims, 2 Drawing Sheets

U.S. PATENT DOCUMENTS

| | | | |
|---|---|---|---|
| 4,871,580 A * | 10/1989 | Schram et al. | 427/562 |
| 5,120,568 A | 6/1992 | Schuurmans et al. | |
| 5,403,399 A * | 4/1995 | Kurihara et al. | 118/723 DC |
| 6,051,114 A * | 4/2000 | Yao et al. | 204/192.3 |
| 6,068,201 A * | 5/2000 | Hawley et al. | 239/69 |
| 6,344,416 B1 | 2/2002 | Furukawa et al. | |
| 6,397,776 B1 * | 6/2002 | Yang et al. | 118/723 MP |
| 6,490,994 B1 * | 12/2002 | Yoshizawa | 118/723 ER |
| 2003/0049468 A1 * | 3/2003 | Hu et al. | 428/451 |

FOREIGN PATENT DOCUMENTS

| | | |
|---|---|---|
| JP | 61-079774 | 4/1986 |

\* cited by examiner

METHOD AND APPARATUS FOR TREATING A SUBSTRATE

This is the U.S. National Stage of International Application PCT/NL2003/000886filed Dec. 12, 2003, which claims priority to NL 1022155, filed Dec. 12, 2002, the entire contents of both herein incorporated by reference.

The invention relates to a method for treating a surface of at least one substrate, wherein the at least one substrate is placed in a process chamber, wherein the pressure in the process chamber is relatively low, wherein a plasma is generated by at least one plasma source.

This method is known from the European patent EP-0-295-752. In the known method, the plasma source is mounted on the process chamber so that the plasma is generated substantially outside the process chamber. Asz a result of the low pressure in the process chamber, a part of the plasma can expand from the plasma source to the process chamber via a passage between the source and chamber to contact the substrate surface. Because the plasma is generated by a plasma source mounted on the process chamber, it has surprisingly been found that a relatively high treatment rate, such as a high deposition rate with PEVCD, can be obtained. This is in contrast with, for instance, a conventional plasma reactor in which the plasma source is located in the process chamber and the substrate to be treated is placed between electrodes of the plasma source, which results in an undesirably low treatment rate.

The known method can be used for different purposes. For instance, using this method, a layer of material can be deposited on the substrate surface of the at least one substrate, in particular by means of Plasma Enhanced Chemical Vapor Deposition (PECVD). In that case, usually, a mixture of treatment gases is led into the plasma to fall apart into reactive fragments. These fragments can react with each other and/or with the substrate surface for the purpose of deposition of the layer. Further, the known method can, conversely, be used to remove material from the substrate surface by means of plasma etching, also called dry etching. In that case, the composition of the plasma usually has an etching effect on the substrate surface. The relatively low pressure in the process chamber is usually subatmospheric, for instance less than 5000 Pa, in particular less then 500 Pa.

A disadvantage of the method according to the opening paragraph hereof is that the control over the uniformity of the treatment leaves much to be desired. As a result, parts of the substrate surface may, for instance, undergo too much or too little treatment, so that, in the case of PECVD and plasma etching respectively, an undesirably thick or thin layer of material is deposited thereon and removed therefrom, respectively, compared to other parts of the substrate surface.

An object of the invention is to obviate these disadvantages of the method referred to in the opening paragraph, in particular to provide a method by means of which the uniformity of the treatment can be very well controlled.

For this purpose, the method according to the invention is characterized in that, during the treatment, at least one plasma source and/or at least one optionally provided treatment fluid supply source is moved relative to the substrate surface.

In this manner, the treatment and particularly its uniformity can be controlled very accurately. The movement allows the amount of plasma reaching a part of the substrate surface to be adjusted as desired. Thus, the at least one plasma source and/or treatment fluid supply source can be moved such that each part of the substrate surface undergoes substantially the same extent of treatment, particularly because each part of this surface is reached by the same amount of plasma. In this manner, for instance, a very good uniformity of the treatment can be obtained, so that a layer of material can be deposited very uniformly on the substrate surface by PECVD or etched from it by dry etching using the plasma. On the other hand, it may be desired to have a non-uniform treatment take place, for instance when a part of the substrate surface is to obtain or lose considerably more or less material. In that case, the plasma source and/or the treatment fluid supply source can be moved relative to the surface such that at least a first part of the substrate surface undergoes a substantially greater extent of treatment than a second part of that surface, in particular in that the first surface part is reached by a larger amount of plasma than the second surface part.

The plasma source and/or the treatment fluid supply source can be moved in various manners. For instance, the plasma source and/or the treatment fluid supply source can be rotated about at least one rotation axis, which axis extends substantially parallel to the substrate surface. Further, the plasma source and/or treatment fluid supply source can be moved in a direction towards or away from the substrate surface. In addition, the plasma source and/or the treatment fluid supply source can be moved in at least one lateral direction relative to the substrate surface. Further, the plasma source and/or treatment fluid supply source can be rotated about an axis extending perpendicularly relative to the substrate surface. Such a movement specifically has effect when the source does not generate rotationally symmetric plasma. During the treatment, the plasma source and/or the treatment fluid supply source can, for instance, carry out one or more three-dimensional movements, for instance to treat three-dimensional surfaces. Such a three-dimensional movement can comprise different translation movements, in different directions. In addition, such a three-dimensional movement can comprise, for instance, one or more rotations, about different rotation axes. During the treatment, the plasma source and/or treatment fluid supply source can, for instance, be moved along at least a part of an outside of a substrate to be treated, for the purpose of treating this outside. The plasma source and/or treatment fluid supply source can, for instance, be moved around at least a part of a substrate. In addition, during the treatment, the plasma source and/or treatment fluid supply source can, for instance, be moved along at least a part of an inside of the substrate to be treated, to treat at least a part of this inside. Each plasma source can carry out a combination of these movements. When the method is carried out using several plasma sources, a number or each of these sources can carry out, for instance, at least one of the above manners of movement.

In the case that a treatment fluid is added to the plasma, in particular for the purpose of PECVD, it is advantageous if the amount of treatment fluid to be added to the plasma is related to the movement of the at least one plasma source.

For instance, the effect of the movement of the at least one plasma source can be enhanced or reduced by adding more or less treatment fluid to the plasma before, during and/or after this movement. Further, in this manner, the amount of treatment fluid can be accurately adjusted to movements of the plasma source to very precisely control treatment of the substrate surface. It is, for instance, possible that plasma from the plasma source needs to cover a smaller distance to the substrate surface when the source is in a first position compared to the distance when, after a certain movement, the source is in a second position. As a result, it is possible that less plasma reaches the substrate surface when the source is in the second position, which can result in loss of effectiveness of a treatment fluid included in the plasma. In that case, more treatment fluid can be added to the plasma when the source is in the second position to compensate for this loss of effectiveness.

According to a further elaboration of the invention, the at least one plasma source is a cascade source, with a treatment fluid being supplied into a prechamber of the cascade source, near a cascade source cathode present in this prechamber.

In this manner, the treatment fluid can be supplied to the plasma in the prechamber using means which are relatively simple and inexpensive to design.

According to an advantageous elaboration of the invention, between the at least one plasma source and the substrate surface, at least one said treatment fluid supply source is arranged to add the treatment fluid to the plasma. In the field, such a treatment fluid supply source is also called a showerhead.

By means of a showerhead, the treatment fluid can be added to the plasma in an easy and proportionally distributed manner. Preferably, during the treatment, the at least one showerhead is moved relative to the substrate surface, with the movement of the showerhead being related to the movement of the at least one plasma source so that the aforementioned advantageous effects of the movement of the plasma source can be optimized, at least are not undone by the presence of the showerhead. For this purpose, the showerhead can, for instance, be coupled to the plasma source.

The plasma source can, for instance, be mounted on the process chamber. Surprisingly, this can yield a relatively high treatment rate, such as a high deposition rate in PECVD. In addition, this plasma source can, for instance, be arranged in the process chamber and/or be movable through at least a part of the process chamber.

According to a further elaboration of the invention, the substrate is provided with at least one cavity at least partly bounded by the substrate surface, while, during treatment, at least a part of the plasma source and/or at least the treatment fluid supply source is and/or has been introduced into this substrate cavity.

In this manner, for instance, an inner surface of a substrate can be properly reached by the plasma source and/or the treatment fluid supply source for the purpose of a desired treatment of this inner surface. The substrate cavity can, for instance, comprise a substantially closed cavity, a closable cavity or a cavity accessible from the surroundings.

The invention further relates to an apparatus for treating a surface of at least one substrate, the apparatus being provided with a process chamber and at least one plasma source.

Such an apparatus is also known from the European patent EP-0-295-752. A disadvantage of this apparatus is that it does not provide sufficient control of the uniformity of a treatment on the substrate surface to be carried out using the apparatus.

According to the present invention, this disadvantage is obviated in that the at least one plasma source and/or at least one optionally provided treatment fluid supply source is movably arranged.

Using the movably arranged plasma source and/or treatment fluid supply source, plasma generated by it can reach different parts of the substrate surface for treatment of this surface, which provides a very high degree of control of the treatment to be carried out.

The invention further provides a substrate provided with a surface with at least one layer of material deposited on it, characterized in that the layer has been deposited using a method and/or using an apparatus as described herein.

The layer of this substrate has been deposited on the substrate surface in a very well controlled manner with a view to a particular desired uniformity. Thus, the properties of this layer are unique compared to layers of substrates deposited by conventional PECVD techniques. The layer can, for instance, have a very uniform thickness or, conversely, a thickness which varies in a particular manner. The substrate surface to be treated can comprise different surfaces, for instance a substantially one-dimensional, two-dimensional or three-dimensional surface.

The invention will be further elucidated with reference to an exemplary embodiment and the drawing, in which.

Figure 1:
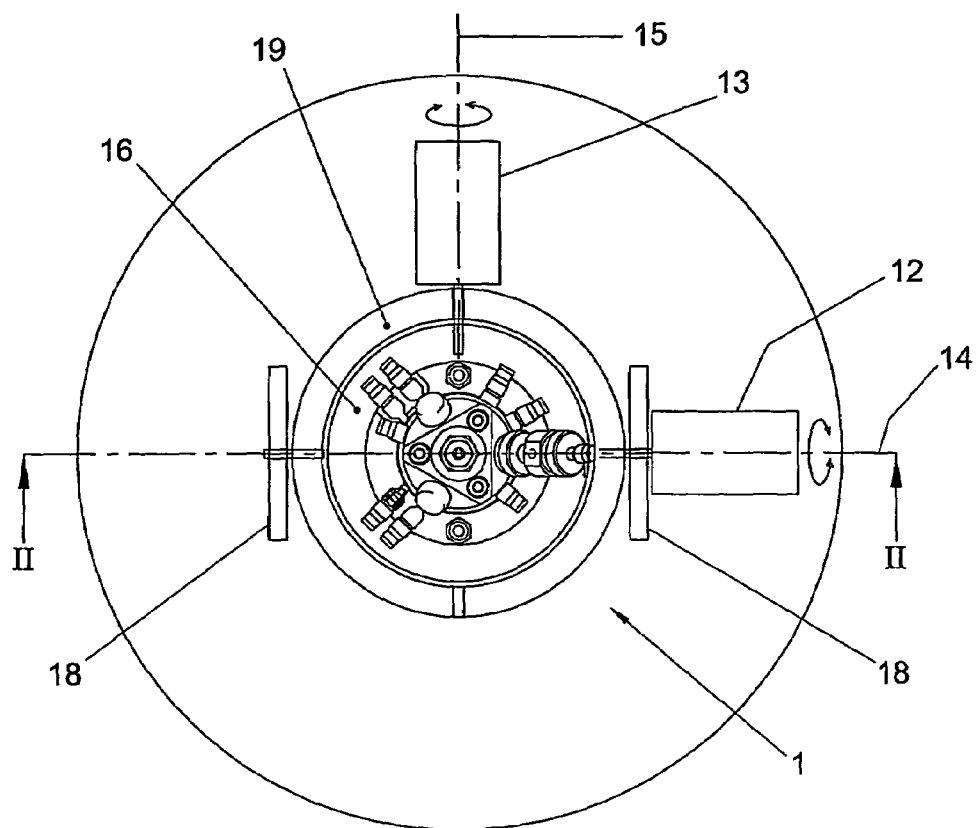
FIG. 1 shows a top plan view of an exemplary embodiment.
Figure 2:
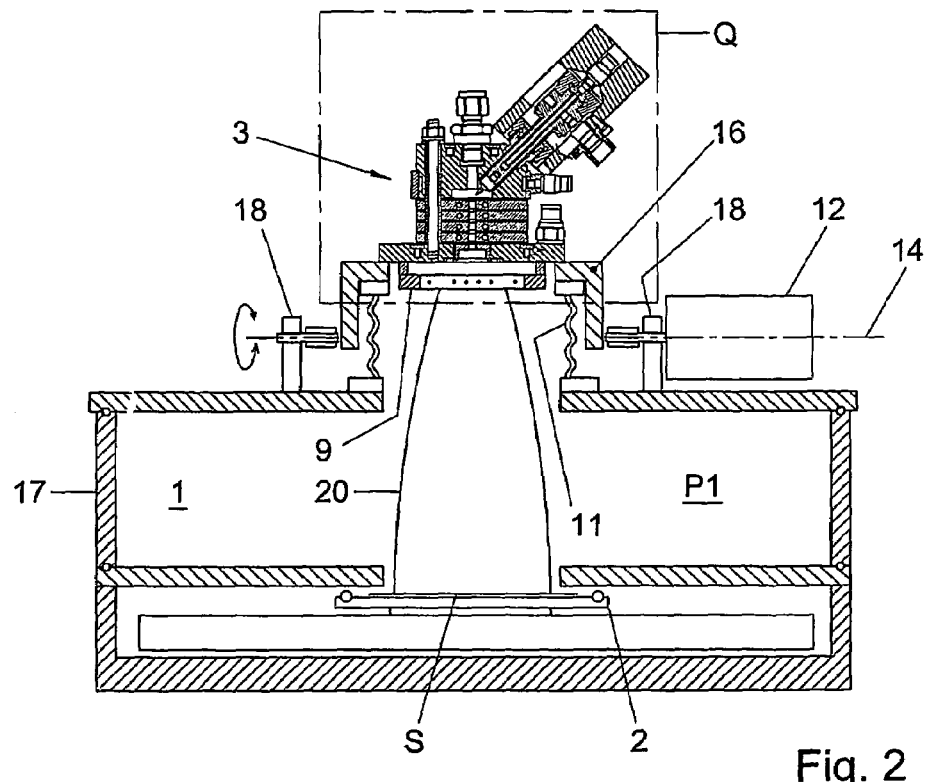
FIG. 2 shows a cross-sectional view along line II-II of the top plan view shown in FIG. 1.
Figure 3:
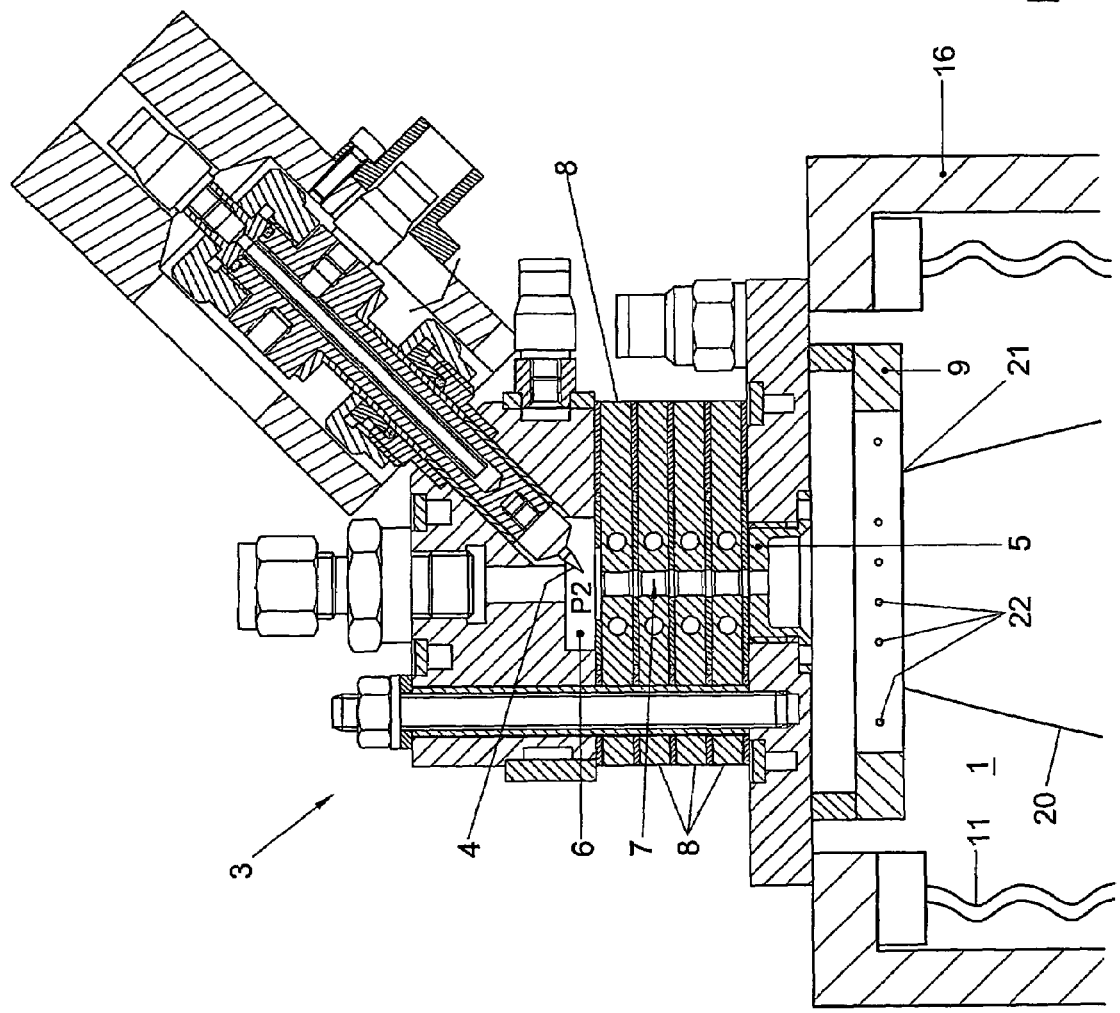
FIG. 3 shows detail Q of the cross-sectional view shown in FIG. 2.

FIGS. 1-3 show an apparatus for treating a surface of a substrate S. The apparatus is particularly arranged for carrying out PECVD. The apparatus is provided with a process chamber 1 and a substrate holder 2 arranged there, on which the substrate S to be treated is placed. On the process chamber 1 and opposite the substrate surface to be treated, a plasma source 3 is mounted.

As FIG. 3 shows, the plasma source is a cascade source 3. The source 3 is provided with a cathode 4 located in a prechamber 6 and an anode 5 located on a side of the source 3 facing the process chamber 1. Via a relatively narrow channel 7, the prechamber 6 opens into the process chamber 1. The channel 7 is bounded by mutually electrically insulated cascade plates 8 and the anode 5. During use, the process chamber 1 is maintained at a relatively low pressure, in particular lower than 5000 Pa, and preferably lower than 500 Pa. Between the cathode 4 and anode 5, a plasma is generated, for instance by ignition of an inert gas, or fluid otherwise suitable for this, present between them. When the plasma has been generated in the source 3, the pressure P2 in the prechamber 6 is higher than the pressure in the process chamber 1. The pressure P2 can, for instance, be substantially atmospheric and be in the range of 0.5-1.5 bar. Because the pressure in the process chamber 1 is considerably lower than the pressure in the prechamber 6, a part 20 of the generated plasma expands such that it extends, via the relatively narrow channel 7, into the process chamber 1 to contact the substrate surface.

The plasma source 3 is movably arranged relative to the substrate surface. For this purpose, the plasma source 3 is mounted on an upper housing part 16 of the apparatus. The upper housing part 16 is coupled to a lower housing part 17 by means of a flexible, substantially gastight sealing. In the present exemplary embodiment, the sealing is designed as a cylindrical resilient body 11. In addition, the resilient body 11 is arranged to exert such a spring force on the at least one plasma source 3, at least via the upper housing part 16, that, under the influence of that spring force, each time, the plasma source 3 can move to the starting position shown in the Figures when the plasma source 3 has been brought to another position. In the present exemplary embodiment, the resilient body 11 is formed by a thin-walled stainless-steel bellows.

For the purpose of moving the plasma source 3, the upper housing part 16 is coupled to the lower housing part 17 so as to be rotatable about two different axes 14, 15. For this purpose, the upper housing part 16 is connected to a bearing ring 19 so as to be rotatable about a rotation axis 15, while this bearing ring 19 is connected, so as to be rotatable about a rotation axis 14, to supports 18 attached on the lower housing part 17. The apparatus is provided with a first motor 12 and a second motor 13 to move the upper housing part 16 with the source 3 to a desired position. Since the two rotation axes 14 and 15 extend perpendicularly to each other, the plasma source 3 can be moved to very many different positions.

As FIGS. 2 and 3 show, the process chamber 1 is provided with a showerhead 9. The showerhead is arranged to add the treatment fluid to the plasma 20 extending via the relatively narrow channel 7 into the process chamber 1, in particular for carrying out PECVD. The showerhead 9 is provided with at least one plasma passage 21 through which the plasma 20 can extend. The showerhead can, for instance, comprise an annular pipe provided with a number of outflow openings 22 through which the treatment fluid can be introduced into the plasma 20. The showerhead 9 is coupled to the plasma source 3, at least via the upper housing part 16, so that the showerhead 9 can follow movements of the plasma source 3.

During use of this apparatus, the plasma source 3 can be moved to obtain a very good control of a plasma treatment of the substrate surface. This is particularly advantageous since this allows, for instance, material to be deposited on the substrate S with a very uniform layer thickness. The upper housing part with the source 3 can, for instance, be moved such that parts of the substrate surface which receive too little plasma, for instance near the edge of the substrate, receive an extra amount of plasma to still undergo sufficient treatment. On the other hand, material can, conversely, be dry etched from the substrate surface in a very uniform manner. In addition, by movement of the source 3, it can be achieved that certain parts of the substrate surface undergo a considerably greater extent of treatment than other parts. For instance, substantially a half of the substrate surface can be treated by a rotation of the source about one of the two rotation axes 14, 15 shown while the other half of the surface remains substantially untreated.

It is self-evident that the invention is not limited to the exemplary embodiment described. Various modifications are possible within the scope of the invention.

For instance, the wording that the at least one source "is mounted on the process chamber" should be interpreted broadly, and can, for instance, include the meaning that the source is mounted on top of, next to, near, under the process chamber or otherwise with respect to the process chamber, but at least such that at least a part of a plasma generated by this source can reach a surface of a substrate S arranged in the process chamber.

Further, the process chamber can be arranged to place one or more than one substrate in it.

A substrate to be treated may, for instance, comprise a semiconductor wafer, a compact or DVD disk such as for storage of music, video, computer data, a solar cell substrate, a display substrate, a reflector, a window, a car window, a synthetic or metal substrate to be coated, a housing, a lamp housing, a catalyst substrate or the like. The substrate may have a disc-shaped, circular, angular or other design. The substrate can, for instance, comprise a three-dimensional object. The surface of the substrate to be treated can, for instance, comprise an inside and/or an outside of the substrate. Further, the substrate surface to be treated can, for instance, comprise a substantially one-dimensional, two-dimensional or three-dimensional surface, an at least partly concave surface, an at least partly convex surface, and/or a combination of similar or differently shaped surfaces.

The material to be deposited by PECVD may comprise various materials, an enumeration of which is outside the scope of this text, but a reference to the elements of the periodic table and possible atomic and/or molecular combinations of these elements gives a fair impression of what can be deposited. The invention is not limited to a movable source but also comprises a fixedly arranged source with a movable treatment fluid supply source. The invention also comprises a method and apparatus provided with multiple movable sources and/or movable treatment fluid supply sources.

Further, the substrate S to be treated and/or the substrate holder 2 can, for instance, also be movably arranged, to be moved during a substrate treatment.

Further, the plasma source and/or the treatment fluid supply source can be moved continuously, at certain moments, iteratively, intermittently, periodically or the like. The movement of the plasma source and/or the treatment fluid supply source can, for instance, be started after the substrate has been placed in a certain treatment position in the process chamber.

The invention claimed is:

1. A method for treating a surface of a substrate using an apparatus including:
   a housing having a first housing part and a second housing part;
   a process chamber defined by the housing and configured to accommodate the subsrate;
   a cascade source connected to the first housing part and having a prechamber, a cathode located in the prechamber a channel that connects the prechamber with the process chamber, and mutually electrically insulated cascade plates that bound the channel;
   a bellows configured to couple the first housing part with the second housing part in a moveably and gastight manner so that the cascade source is movable relative to the second housing part and the process chamber;
   a first motor arranged outside of the process chamber and configured to rotate the first housing part relative to the second housing part around a first axis; and
   a second motor arranged outside of the process chamber and configured to rotate the first housing part relative to the second housing part around a second axis,
   the method comprising:
   placing a substrate having the substrate surface in the process chamber;
   pressurizing the prechamber to a pressure that is higher than the pressure in the process chamber;
   generating a plasma plume using the cascade source such that the plasma extends via the channel into the process chamber for treating the substrate surface; and
   moving the cascade source and the plasma plume relative to the substrate surface while treating the substrate surface by controlling one or both of the first and the second motors so as to rotate the first housing part with the cascade source around one or both of the first and the second axes relative to the second housing part.

2. A method according to claim 1, wherein the cascade source is moved in a direction towards the substrate surface or away from it.

3. A method according to claim 1, wherein the cascade source is moved in at least one lateral direction relative to the substrate surface.

4. A method according to claim 1, wherein the cascade source is rotated about an axis extending perpendicularly relative to the substrate surface.

5. A method according to claim 1, wherein a treatment fluid is added to the plasma.

6. A method according to claim 5, wherein the amount of treatment fluid to be added to the plasma is related to the movement of the cascade source.

7. A method according to claim 5, wherein the treatment fluid is supplied into the prechamber of the cascade source near the cathode.

8. A method according to claim 5, wherein, between the cascade source and the substrate surface, a treatment fluid supply source is arranged to add the treatment fluid to the plasma.

9. A method according to claim 8 wherein, during the treatment the treatment fluid supply source is moved relative to the substrate surface, and the movement of the treatment fluid supply source is related to the movement of plasma cascade source.

10. A method according to claim 1, wherein the plasma cascade source is moved such that each part of the substrate surface undergoes substantially the same extent of treatment such that each part of the substrate surface receives the same amount of plasma.

11. A method according to claim 1, wherein the cascade source is moved such that at least a first part of the substrate surface undergoes substantially a greater extent of treatment than a second part of the substrate surface such that the first surface part receives a larger amount of plasma than the second surface part.

12. A method according to claim 1, wherein said substrate is provided with at least one cavity at least partly bounded by said substrate surface, wherein, during treatment, at least a part of said cascade source is introduced into said substrate cavity.

13. A method according to claim 1, wherein, during the treatment, said cascade source carries out at least one three-dimensional movement.

14. A method according to claim 5, wherein the treatment fluid is added to the plasma for the purpose of PECVD.

15. A method according to claim 1, wherein the first and second axes are substantially parallel to the substrate surface.

16. A method according to claim 15, wherein the second axis is substantially perpendicular to the first axis.

* * * * *